US009791514B2

(12) United States Patent
Nishizawa (10) Patent No.: US 9,791,514 B2
(45) Date of Patent: Oct. 17, 2017

(54) RECYCLED SECONDARY BATTERY SUPPLY FORECAST SYSTEM AND RECYCLED SECONDARY BATTERY SUPPLY FORECAST USAGE

(75) Inventor: Toshihiro Nishizawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 14/007,522

(22) PCT Filed: Mar. 23, 2012

(86) PCT No.: PCT/JP2012/057565
§ 371 (c)(1),
(2), (4) Date: Sep. 25, 2013

(87) PCT Pub. No.: WO2012/133212
PCT Pub. Date: Oct. 4, 2012

(65) Prior Publication Data
US 2014/0019001 A1  Jan. 16, 2014

(30) Foreign Application Priority Data
Mar. 29, 2011  (JP) .................................. 2011-071836

(51) Int. Cl.
*B60L 11/18* (2006.01)
*G01R 31/36* (2006.01)
(Continued)

(52) U.S. Cl.
CPC ...... *G01R 31/3627* (2013.01); *B60L 11/1857* (2013.01); *H01M 10/48* (2013.01);
(Continued)

(58) Field of Classification Search
None
See application file for complete search history.

(56) References Cited

U.S. PATENT DOCUMENTS 5,977,750 A * 11/1999 Ng et al. ........................ 320/132
6,181,100 B1 * 1/2001 Shoji .............................. 320/103
(Continued)

FOREIGN PATENT DOCUMENTS

CN  1913217 A  2/2007
DE  102006000397 A  2/2007
(Continued)

OTHER PUBLICATIONS

Machine translation of JP 2007141464 A.*
(Continued)

*Primary Examiner* — Navid Ziaeianmehdizadeh
(74) *Attorney, Agent, or Firm* — Wilmer Cutler Pickering Hale and Dorr LLP (57) ABSTRACT

A recycled battery supply forecast unit 201 of a battery management server 20 receives, from a plurality of vehicles 40, performance information of a secondary battery 403 mounted on each of the vehicles 40 and state information of the vehicle for determining a life of the vehicle 40, makes a forecast of an end of life of the vehicle 40 by using history of the state information of that vehicle, and makes a forecast of performance of the secondary battery 403 at the end of life of that vehicle 40 by using history of the performance information of the secondary battery 403. In addition, a forecast is made of a supply quantity of recyclable secondary batteries at a certain point in time in the future based on a forecast result of the performance of the secondary battery 203 at the end of life of each vehicle 40.

10 Claims, 8 Drawing Sheets

(51) Int. Cl.
*H01M 10/48* (2006.01)
*H01M 10/54* (2006.01)

(52) U.S. Cl.
CPC ........ *H01M 10/54* (2013.01); *H01M 2220/20* (2013.01); *Y02W 30/84* (2015.05)

(56) References Cited

U.S. PATENT DOCUMENTS

| | | | |
|---|---|---|---|
| 6,317,697 B1* | 11/2001 | Yoshikawa et al. | 702/63 |
| 6,845,332 B2* | 1/2005 | Teruo | 702/63 |
| 8,604,755 B2* | 12/2013 | Nishimura et al. | 320/132 |
| 2006/0232240 A1* | 10/2006 | Salasoo et al. | 320/119 |
| 2007/0029974 A1* | 2/2007 | Uchida | G01R 31/3624 |
| | | | 320/132 |
| 2007/0250229 A1* | 10/2007 | Wu | 701/29 |
| 2007/0284163 A1* | 12/2007 | Heap et al. | 180/65.2 |
| 2008/0249726 A1* | 10/2008 | Plett | 702/63 |
| 2008/0249745 A1* | 10/2008 | Heap et al. | 702/183 |
| 2008/0263100 A1* | 10/2008 | Van Engelshoven et al. | 707/104.1 |
| 2009/0070052 A1* | 3/2009 | Taniguchi et al. | 702/63 |
| 2010/0007481 A1 | 1/2010 | Uchida | |
| 2010/0312744 A1* | 12/2010 | Prokhorov et al. | 706/52 |
| 2010/0324846 A1* | 12/2010 | Marsh et al. | 702/63 |
| 2010/0332166 A1* | 12/2010 | Shin | 702/63 |
| 2011/0004428 A1* | 1/2011 | Murochi et al. | 702/63 |
| 2011/0301789 A1* | 12/2011 | Sung | 701/22 |
| 2012/0053837 A1 | 3/2012 | Viassolo et al. | |
| 2013/0030739 A1* | 1/2013 | Takahashi et al. | 702/63 |

FOREIGN PATENT DOCUMENTS

| | | | |
|---|---|---|---|
| DE | 102009027595 A1 | | 1/2010 |
| JP | 2007-074891 | | 3/2007 |
| JP | 2007-141464 | | 6/2007 |
| JP | 2007141464 A | * | 6/2007 |
| JP | 2007-195312 | | 8/2007 |
| JP | 2007195312 A | * | 8/2007 |
| JP | 2010-022154 | | 1/2010 |
| JP | 2010-045901 | | 2/2010 |
| JP | WO 2011125213 | * | 10/2011 |

OTHER PUBLICATIONS

Machine translation of JP 2007195312.*
International Search Report of PCT/JP2012/057565 mailed Apr. 24, 2012.

* cited by examiner

DATA LIST OF HISTORY OF VEHICLE STATE AND BATTERY PERFORMANCE OF SPECIFIC VEHICLE

| BATTERY ID | BATTERY TYPE | HISTORY NUMBER | DATA RECORDED DATE AND TIME | TRAVEL DISTANCE [km] | PLACE OF USE | CURRENT TOTAL CAPACITY OF BATTERY [kWh] | CURRENT MAXIMUM OUTPUT CURRENT OF BATTERY [C] | NUMBER OF NORMAL CHARGING [NUMBER OF TIMES] | NUMBER OF RAPID CHARGING [NUMBER OF TIMES] |
|---|---|---|---|---|---|---|---|---|---|
| 101 | A | 100 | 2012/10/15 18:00 | 20216 | TOKYO | 23.6 | 9.8 | 485 | 105 |
| 101 | A | 99 | 2012/10/8 11:00 | 20003 | KAWASAKI | 23.6 | 9.8 | 482 | 105 |
| 101 | A | 98 | 2012/10/1 8:00 | 19808 | TOKYO | 23.6 | 9.8 | 480 | 103 |
| ... | ... | ... | ... | ... | ... | ... | ... | ... | ... |
| 101 | A | 2 | 2010/10/8 12:00 | 212 | TOKYO | 24.0 | 10.0 | 4 | 1 |
| 101 | A | 1 | 2010/10/1 20:00 | 0 | TOKYO | 24.0 | 10.0 | 0 | 0 |

Fig. 7

DATA LIST OF FORECAST RESULT OF VEHICLE LIFE AND BATTERY PERFORMANCE OF PLURALITY OF VEHICLES

| BATTERY ID | BATTERY TYPE | DATE OF START OF USE | INITIAL CAPACITY OF BATTERY [kWh] | VEHICLE LIFE TRAVEL DISTANCE [km] | VEHICLE LIFE FORECASTED DATE AND TIME | FORECASTED DEGRADATION RATIO [%] OF TOTAL CAPACITY OF BATTERY AT END OF VEHICLE LIFE |
|---|---|---|---|---|---|---|
| 101 | A | 2010/10/1 20:00 | 16.0 | 80000 | 2018/9/1 | 70 |
| 102 | B | 2011/8/10 10:00 | 24.0 | 100000 | 2021/4/1 | 80 |
| 103 | A | 2012/1/14 12:00 | 16.0 | 80000 | 2023/6/1 | 60 |
| 201 | B | 2015/9/23 10:00 | 24.0 | 100000 | 2022/6/1 | 80 |
| 202 | B | 2016/5/5 8:00 | 24.0 | 100000 | 2023/9/1 | 60 |
| 301 | C | 2019/4/19 14:00 | 9.0 | 70000 | 2027/1/1 | 70 |

Fig. 8

DATA LIST OF FORECASTED SUPPLY QUANTITY OF RECYCLED BATTERIES

| SUPPLY TIMING | BATTERY TYPE | FORECASTED SUPPLY QUANTITY [UNIT] FOR EACH CAPACITY DEGRADATION RATIO OF RECYCLED SECONDARY BATTERY | | | |
|---|---|---|---|---|---|
| | | DEGRADATION RATIO: 100 - 90% | DEGRADATION RATIO: 90 - 80% | DEGRADATION RATIO: 80 - 70% | DEGRADATION RATIO: 70% OR LESS (SUBJECT TO DISPOSAL) |
| 2020/4 | A | 0 | 600 | 1000 | 800 |
| 2020/5 | A | 0 | 700 | 1200 | 700 |
| 2020/6 | A | 10 | 600 | 900 | 800 |
| 2020/7 | A | 0 | 500 | 1000 | 700 |
| 2020/8 | A | 20 | 600 | 1100 | 700 |
| 2020/9 | A | 0 | 800 | 1200 | 600 |

RECYCLED SECONDARY BATTERY SUPPLY FORECAST SYSTEM AND RECYCLED SECONDARY BATTERY SUPPLY FORECAST USAGE

CROSS-REFERENCE TO RELATED APPLICATIONS

This application is a national stage application of International Application No. PCT/JP2012/057565, entitled "Recycled Secondary Battery Supply Forecast System and Recycled Secondary Battery Supply Forecast Usage," filed on Mar. 23, 2012, which claims the benefit of the priority of Japanese patent application No. 2011-071836, filed on Mar. 29, 2011, the disclosures of each of which are hereby incorporated by reference in their entirety.

BACKGROUND

The present invention relates to a recycled secondary battery supply forecast system and recycled secondary battery supply forecast usage for forecasting the quantity level of recyclable secondary batteries that can be supplied.

Secondary batteries that are mounted on electrically driven vehicles and the like use globally limited resources such as nickel, cadmium and cobalt. Thus, from the perspective of environmental protection, the reuse and recycling of secondary batteries are desirable. As electrically driven vehicles equipped with secondary batteries, there are electric cars and hybrid vehicles equipped with both an internal combustion engine and a motor. In order to drive this kind of electrically driven vehicle with electricity, the mounted secondary batteries need to be charged using an external charger. Generally speaking, when a secondary battery is used for a long period, the performance thereof will degrade due to the repeated charging and discharging process. This degradation leads to decrease of the total capacity and maximum output current of the secondary battery. Moreover, the secondary battery will swell and deform accompanying such degradation.

Moreover, since secondary batteries are manufactured using rare metals, the manufacturing cost is extremely high. Thus, when a vehicle reaches its life, if the secondary batteries that were used in that vehicle have not degraded considerably, the manufacturing cost of another device can be reduced by reusing such secondary batteries in that other device. Moreover, when a vehicle reaches its life, if the secondary batteries that were used in that vehicle have degraded to the extent that they cannot be reused, by disposing such degraded secondary batteries and recycling the rare metals and the like, and using the recycled materials for the manufacture of a new secondary battery, the manufacturing cost of the new secondary battery can be reduced.

For a manufacturer of devices that have recycled batteries built therein, it is extremely important to grasp the quantity level and the performance level of recyclable secondary batteries that can be supplied and when such a quantity can be supplied upon devising its battery procurement plan and the device manufacturing plan. Moreover, for a secondary battery manufacturer, being able to grasp an amount of recycled materials that can be supplied and when such recycled materials can be supplied is extremely important information upon devising its secondary battery material procurement plan and the secondary battery manufacturing plan.

As an example of conventional technology related to the optimization of reusing secondary batteries, Patent Document 1 describes collecting battery information, which is unique to a secondary battery, in a battery information management device on a communication network, wherein the battery information management device sorts by the grade the secondary batteries when they are recycled based on the battery information which is unique to that secondary battery.

Patent Document 1: Patent Publication JP-A-2007-141464

Nevertheless, with the technology disclosed in Patent Document 1, while the secondary batteries are sorted by grade when they are recycled, there is a problem in that it is not possible to forecast the quantity level and the performance level of recyclable secondary batteries that can be supplied and when such a quantity can be supplied.

SUMMARY

Thus, an exemplary object of this invention is to provide a system capable of forecasting the quantity level and the performance level of recyclable secondary batteries that can be supplied.

The recycled secondary battery supply forecast system according to the present invention comprises a vehicle life/battery performance forecast unit which receives, from a plurality of vehicles, performance information of a secondary battery mounted on each of the vehicles and state information of the vehicle for determining a life of the vehicle, makes a forecast of an end of life of the vehicle by using history of the state information of that vehicle, and makes a forecast of performance of the secondary battery at the end of life of that vehicle by using history of the performance information of the secondary battery, and a battery supply quantity forecast unit which makes a forecast of a supply quantity of recyclable secondary batteries at a certain point in time in the future based on a forecast result of the performance of the secondary battery at the end of life of each vehicle.

According to an exemplary aspect of the present invention, it is possible to forecast the quantity level and the performance level of recyclable secondary batteries that can be supplied.

EXEMPLARY EMBODIMENT

Embodiment 1

An exemplary embodiment for working the present invention is now explained in detail with reference to the drawings.

Figure 1:
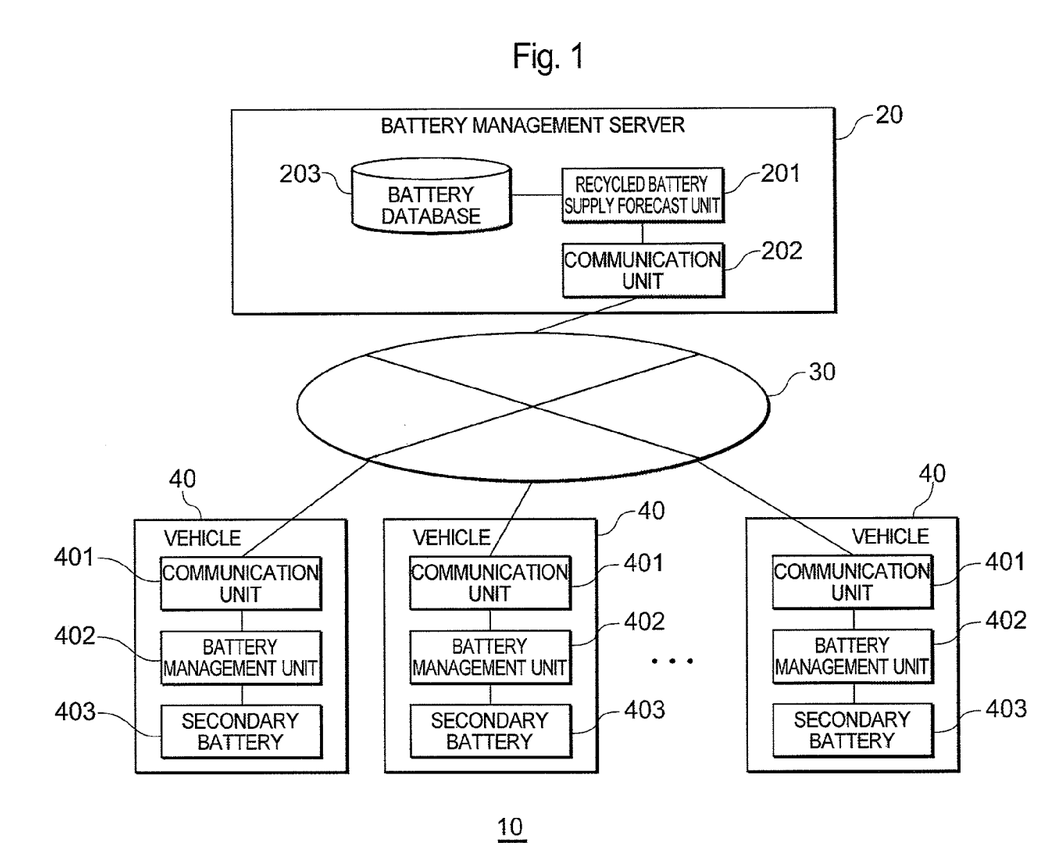
FIG. 1 is a block diagram showing the configuration of the recycled secondary battery supply forecast system according to Embodiment 1 of the present invention.

FIG. 1 is a block diagram showing the configuration of a recycled secondary battery supply forecast system 10 according to Embodiment 1 of the present invention. As shown in the diagram, the recycled secondary battery supply forecast system 10 comprises a battery management server 20, a communication network 30, and a vehicle 40. The battery management server 20 and the vehicle 40 are connected via the communication network 30.

The battery management server 20 comprises a recycled battery supply forecast unit 201, a communication unit 202, and a battery database 203. The battery management server 20 may be a dedicated or general computer comprising a CPU, a memory such as a ROM or a RAM, an external storage device for storing various types of information, and an input interface, an output interface, a communication interface, and a bus for connecting the foregoing components. The battery management server 20 may be configured from a single computer or configured from a plurality of computers which are mutually connected via a communication line.

The recycled battery supply forecast unit 201 and the communication unit 202 correspond to functional modules that are realized by the CPU executing predetermined programs stored in the ROM or the like. The battery database 203 is loaded from an external storage device.

Figure 2:
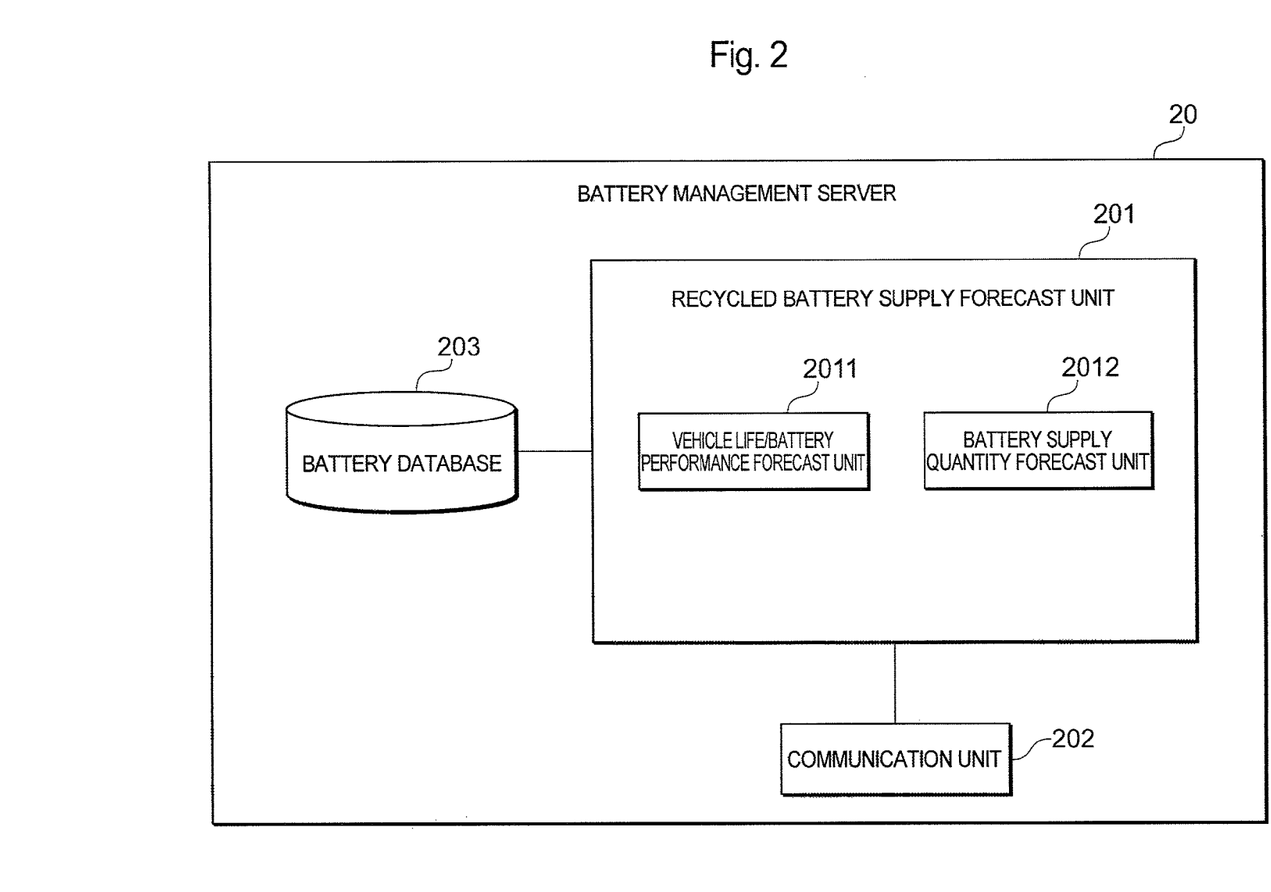
FIG. 2 is a block diagram showing the detailed configuration of the battery management server according to Embodiment 1 of the present invention.

FIG. 2 is a block diagram showing the detailed configuration of the battery management server 20. As shown in FIG. 2, the recycled battery supply forecast unit 201 comprises a vehicle life/battery performance forecast unit 2011, and a battery supply quantity forecast unit 2012.

As shown in FIG. 1, the vehicle 40 is equipped with a communication unit 401, a battery management unit 402, and a secondary battery 403. The secondary battery 403 is a lithium ion secondary battery, a nickel metal hydride secondary battery, a lead secondary battery, or a similar secondary battery. The communication unit 401 is communication means based on a mobile phone, wireless LAN, infrared communication or power line communication on a power line that is connected during charging, or similar communication means.

The operation of the recycled secondary battery supply forecast system 10 is now explained with reference to FIGS. 3 and 4.

Figure 3:
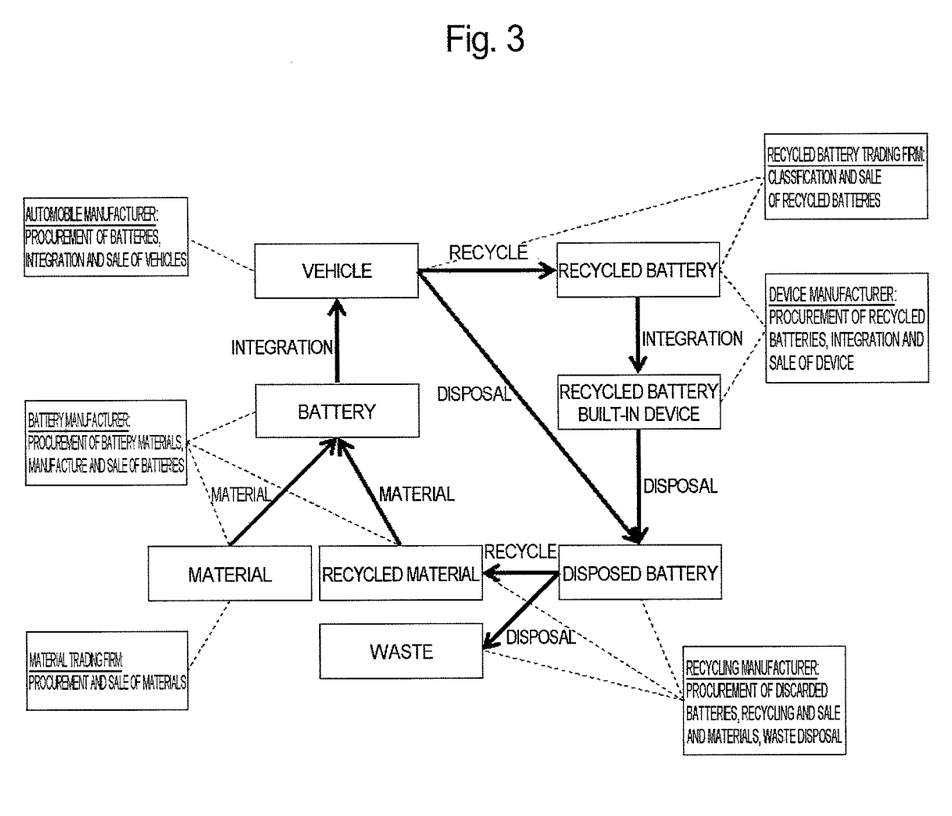
FIG. 3 is a flowchart showing the lifecycle of a secondary battery.

FIG. 3 is a flowchart showing the lifecycle of the secondary battery 403. In FIG. 3, a material trading firm procures and sells battery materials. A battery manufacturer procures new materials and recycled materials as battery materials, and manufactures and sells batteries. An automobile manufacturer procures batteries, installs the batteries in vehicles, and sells the vehicles.

A recycled battery trading firm classifies whether the batteries of vehicles that reached its life can be reused and sells recyclable batteries, and disposes batteries that cannot be reused. A device manufacturer of devices with a recycled battery built therein procures recycled batteries, installs the recycled batteries in devices, and sells the recycled battery built-in devices. A recycling manufacturer procures unrecyclable discarded batteries that were removed from vehicles and recycled battery built-in devices, recycles and sells materials, and disposes waste that cannot be recycled. In a lifecycle of a secondary battery, a recyclable battery may also be reused in a separate vehicle. Moreover, a once-used battery may also be reused in a separate device once again.

Next, in the lifecycle of batteries shown in FIG. 3, how the recycled battery supply quantity and discarded battery supply quantity forecasted by the recycled secondary battery supply forecast system 10 according to this embodiment are used by which business operator is now explained.

For a device manufacturing of devices with a recycled battery built therein, being able to grasp the quantity level and the performance level of batteries that can be supplied and when such a quantity can be supplied is important information upon devising its recycled battery procurement plan and the device manufacturing plan. Moreover, for a recycling manufacturer, being able to grasp the quantity level of discarded batteries that can be supplied and when such a quantity can be supplied is important information upon devising its discarded battery procurement plan and recycling plan. Moreover, for a battery manufacturer, being able to grasp an amount of recycled materials that can be supplied and when such recycled materials can be supplied is extremely important information upon devising its battery material procurement plan and the battery manufacturing plan.

Figure 4:
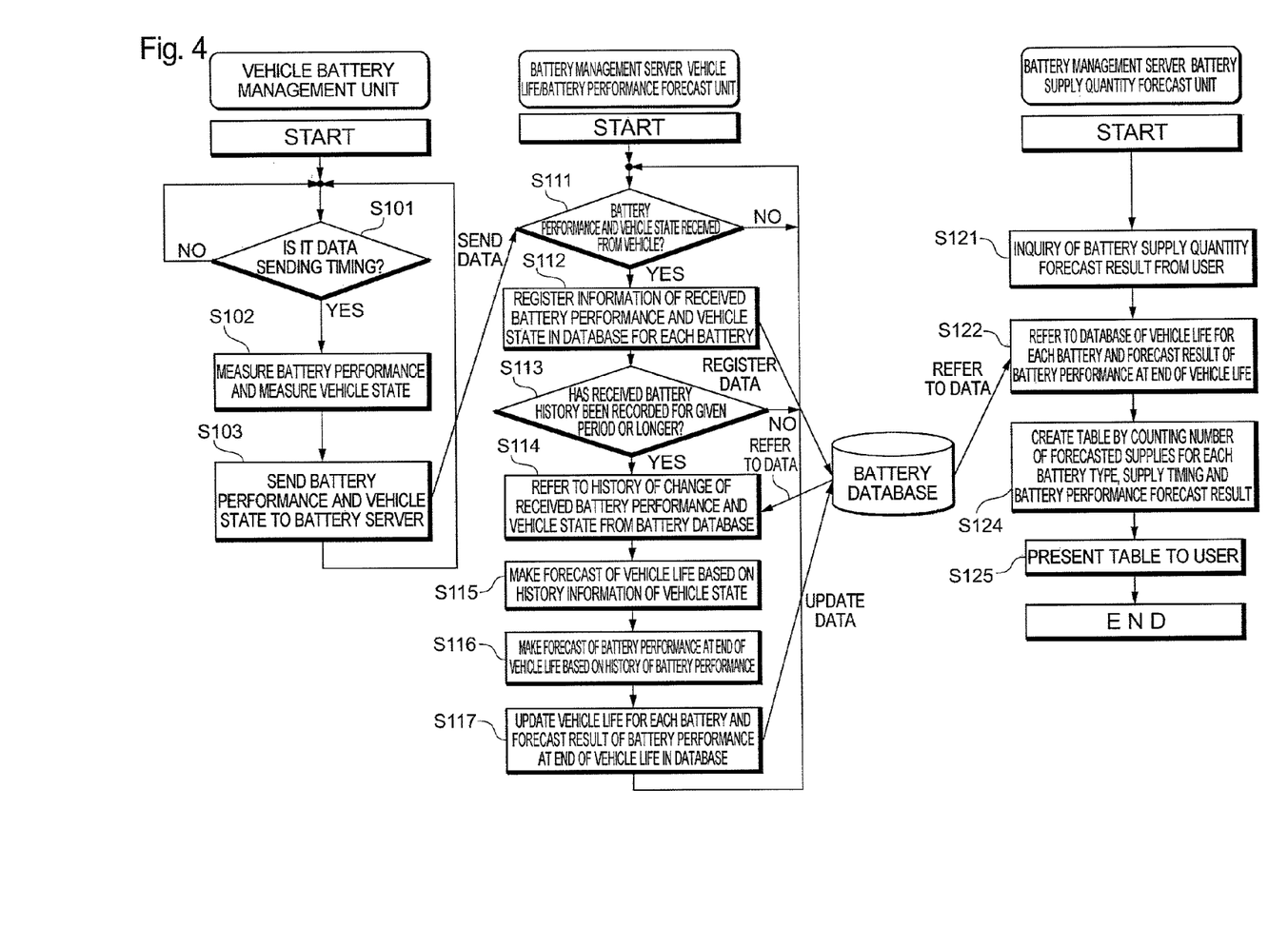
FIG. 4 is a sequence diagram of the processing for making a forecast of the supply of recycled batteries according to Embodiment 1 of the present invention.

FIG. 4 is a sequence diagram of the processing for making a forecast of the supply of recycled batteries.

The processing of the battery management unit 402 of the vehicle 40 is now explained.

Foremost, the battery management unit 402 stands by until reaching the timing of sending the performance information of the secondary battery 403 and the state information of the vehicle 40 to the battery management server 20 (step S101). The data sending timing may be the timing that a given period such as one day or one week has elapsed. Otherwise, the data sending timing may also be the timing that the vehicle 40 was used and stopped, and the key was removed therefrom, or the timing that the charging of the secondary battery 403 is completed. Here, as one example, data is sent every other week.

Upon reaching the data sending timing (step S101: YES), the battery management unit 402 measures the performance of the secondary battery 403 and measures the state of the vehicle 40 (step S102).

As the performance information of the secondary battery 403, the total capacity of the secondary battery 403 and the maximum output current of the secondary battery 403 are measured. Generally speaking, when a secondary battery is used for a long period, the performance thereof will degrade due to the repeated charging and discharging process, and the total capacity and maximum output current will decrease. Moreover, when a secondary battery is used for a long period, it is known that the secondary battery will swell. Accordingly, the swelling of the secondary battery may also be measured using a pressure sensitive sensor installed around the battery and used as performance information.

Moreover, as information of the vehicle state, the travel distance and the used hours are measured. For example, it is possible to mount a GPS on the vehicle 40 and use the measured latitude/longitude information as the vehicle state.

Subsequently, the measured battery performance and vehicle state are sent to the battery management server 20 (step S103).

The processing of the vehicle life/battery performance forecast unit 2011 of the battery management server 20 is now explained.

Foremost, the battery performance forecast unit 2011 stands by to receive information on the battery performance and vehicle state from the vehicle 40 (step S111).

Upon receiving the battery performance and vehicle state from the vehicle 40 (step S111: YES), the battery performance forecast unit 2011 registers this information in the battery database 203 (step S112). Here, if data received from the vehicle 40 is data that has not been registered in the database, a battery ID is given so that the battery can be identified. In the battery database 203, the battery performance of a specific vehicle for each battery and the history data of the vehicle state are recorded.

Figure 5:
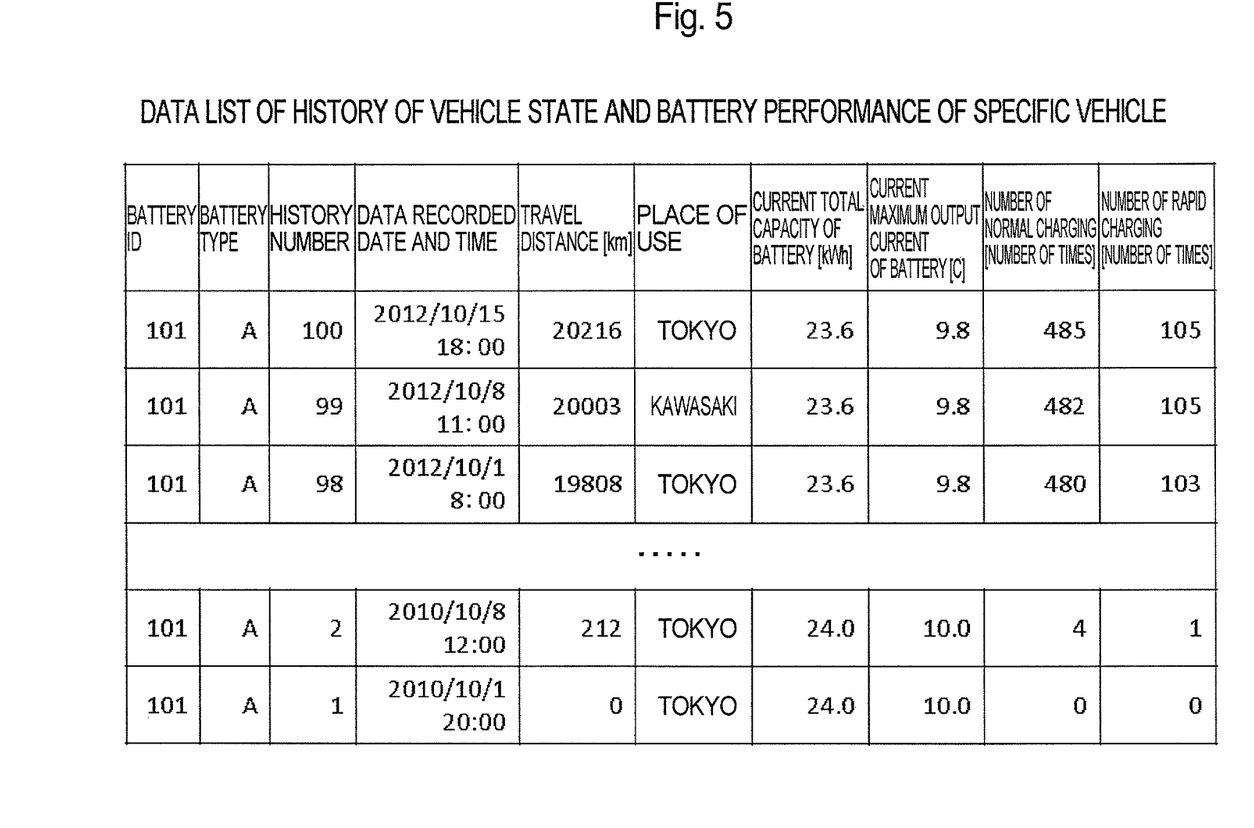
FIG. 5 is a diagram showing an example of history data of the battery performance and vehicle state of a specific vehicle according to Embodiment 1 of the present invention.

FIG. 5 is a diagram showing an example of history data of the battery performance and vehicle state of a specific vehicle. As history data, recorded are a battery type for identifying the type of battery, a history number for indicating how many times the data has been received, a data recorded date and time on which the data was received and recorded, a travel distance, place of use, and, as the battery performance, current battery total capacity, current battery maximum output current, number of normal charging and number of rapid charging.

Subsequently, the battery performance forecast unit 2011 determines whether the received battery history data has been recorded for a given period or longer (step S113). Specifically, the battery performance forecast unit 2011 analyzes the type of changes in the past by using the history information recorded during a certain given period of time, and subsequently makes a forecast of the vehicle life and makes a forecast of the battery performance in the future. In this embodiment, the minimum accumulation period of history information for making a forecast of the vehicle life and the battery performance in the future shall be one year.

Subsequently, the battery performance forecast unit 2011 refers to the past battery performance of the battery and the history information of the vehicle state from the battery database 203 (step S114). Subsequently, the battery performance forecast unit 2011 makes a forecast of the vehicle life based on the history information of the vehicle state (step S115).

Figure 6:
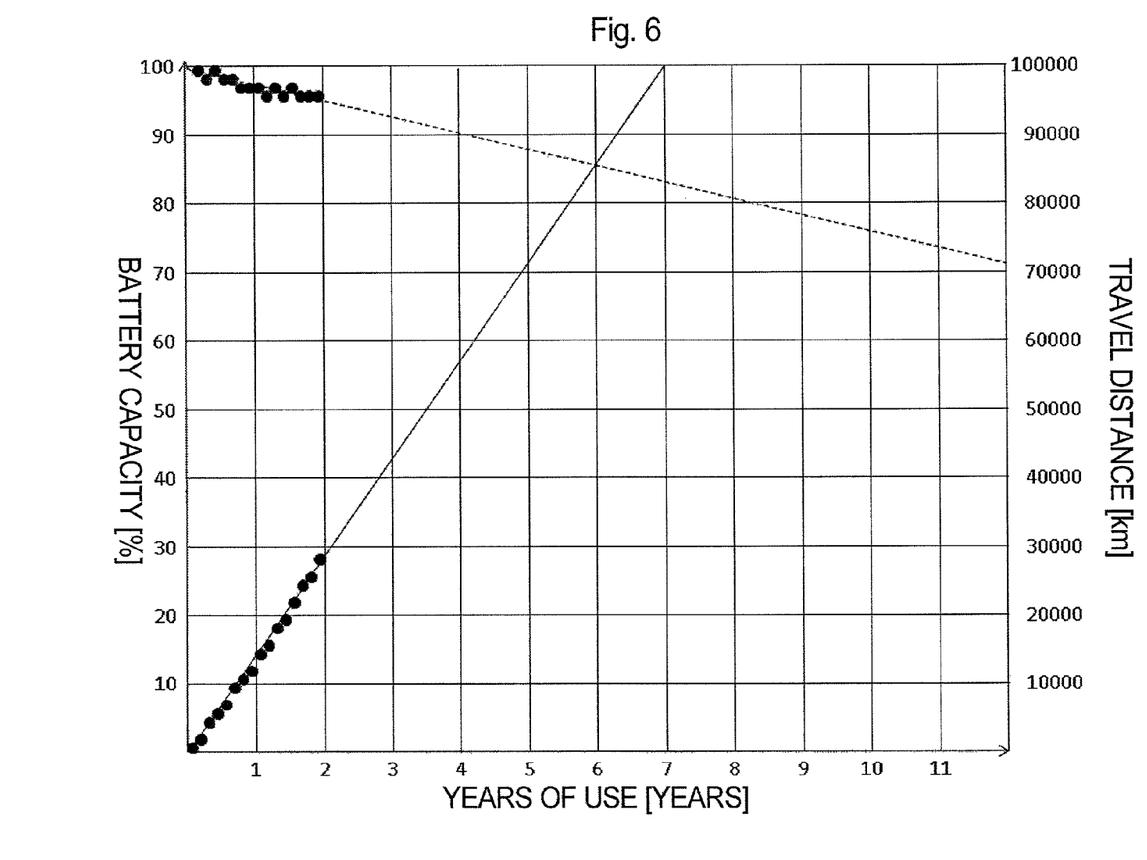
FIG. 6 is a graph showing the relation of the battery capacity, the travel distance and the years of use of a specific vehicle.

The method of making a forecast of the vehicle life is now explained with reference to FIG. 6. FIG. 6 is a graph showing the relation of the battery capacity, the travel distance and the years of use of a specific vehicle. Here, when a vehicle reaches a certain predetermined travel distance, this is defined as the end of life of that vehicle. This travel distance will differ depending on the model of the car. Specifically, for instance, the point in time that the vehicle travelled 100,000 kilometers is defined as the end of life of that vehicle.

Based on the history information of the vehicle state of the corresponding vehicle, points are plotted with the period of use (number of years) and travel distance as both axes to draw a graph. By performing linear approximation to the plotted points, it is possible to draw a line which makes a forecast of the increase in travel distance. The period of use when the travel distance will reach 100,000 kilometers is forecasted as the vehicle life. In the example of FIG. 6, the straight line of the future increase forecast is drawn from the information regarding the travel distance of a two-year period from the start of use, and the forecast is that the vehicle will reach 100,000 kilometers seven years later. Thus, the vehicle life is forecasted to be seven years after the start of use.

Moreover, a polynomial approximate curve such as a quadratic curve or a similar approximate curve may be used for making a forecast of the future value of travel distance. Moreover, as the method of determining the vehicle life, a method of making a forecast based on the total number of hours that the vehicle was actually driven may also be used. For example, a vehicle may be determined as having reached its vehicle life after being driven for 10,000 hours.

Moreover, as another method of determining the vehicle life, the vehicle life may be determined based on the period of use. For example, when ten years lapse from the start of use, this may be defined as being the vehicle life. Moreover, means for allowing the user to freely define the travel distance, used hours, and period of use for determining the life may also be provided.

Subsequently, the battery performance forecast unit 2011 makes a forecast of the battery performance at the end of the vehicle life based on the history information of the battery performance (step S116). The method of making a forecast of the battery performance at the end of the vehicle life is now explained with reference to FIG. 6. In this embodiment, the battery performance is defined based on the degradation ratio of the total capacity of the battery. Points are plotted with the period of use (number of years) and the battery capacity and a graph is drawn using the history information of the degradation ratio of the total capacity of the battery of the corresponding vehicle. By performing linear approximation to the plotted points, it is possible to draw a line as a forecast of the decrease in the degradation ratio of the total capacity of the battery. Here, since the life of the corresponding vehicle was forecasted to be seven years after the start of use, it is possible to forecast that the battery capacity at the end of the vehicle lift (7th year of use) will be 83% from the graph of FIG. 6.

Note that a polynomial approximate curve such as a quadratic curve or a similar approximate curve may be used for making a forecast of the future value of battery performance. Moreover, the battery performance may be defined based on the degradation ratio of the maximum output electric energy at the end of the vehicle life by using the history information of the maximum output current of the battery.

Based on the foregoing processing, it is possible to make a forecast of the performance of the battery at the end of the vehicle life in a specific vehicle.

Figure 7:
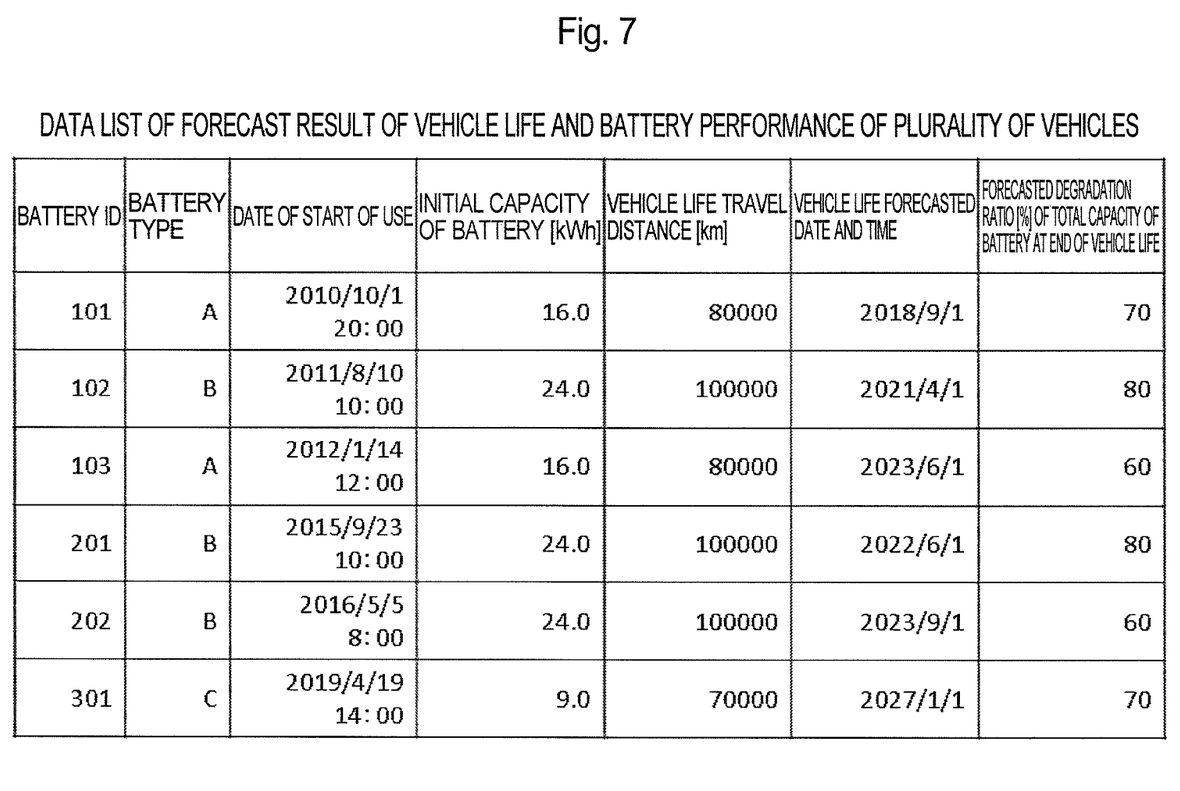
FIG. 7 is a diagram showing an example of the forecast result of the vehicle life and battery performance of a plurality of vehicles according to Embodiment 1 of the present invention.

Subsequently, the battery performance forecast unit 2011 uses the forecast results of the vehicle life and the battery performance and updates the battery database 203 (step S117). An example of a data list of the forecast results of the vehicle life and battery performance of a plurality of vehicles is shown in FIG. 7. This data includes information of a battery ID for identifying the battery, a battery type for identifying the battery type, date of start of use of battery, initial capacity of battery, life travel distance of vehicle defined for each type of car, vehicle life forecasted date and time, and forecasted degradation ratio of total capacity of battery at end of vehicle life.

The processing of the battery supply quantity forecast unit 2012 of the battery management server 20 is now explained with reference to FIG. 4.

Foremost, the battery supply quantity forecast unit 2012 receives an inquiry regarding the battery supply quantity forecast result from a user (step S121). The user can make an inquiry by designating data of desired conditions. For example, the user can designate the period and battery type such as the forecasted supply quantity of the recyclable batteries of battery type A during the period from April to September 2020.

Subsequently, the battery supply quantity forecast unit 2012 refers to the database of the vehicle life for each battery and the battery performance forecast result at the end of the vehicle life (step S122). The battery supply quantity forecast unit 2012 refers to the battery performance forecast result of batteries corresponding to the battery type and supply timing requested by the user regarding all batteries registered in the battery database 203, and creates a table upon counting the number of forecasted supplies of recycled batteries (step S124).

Figure 8:
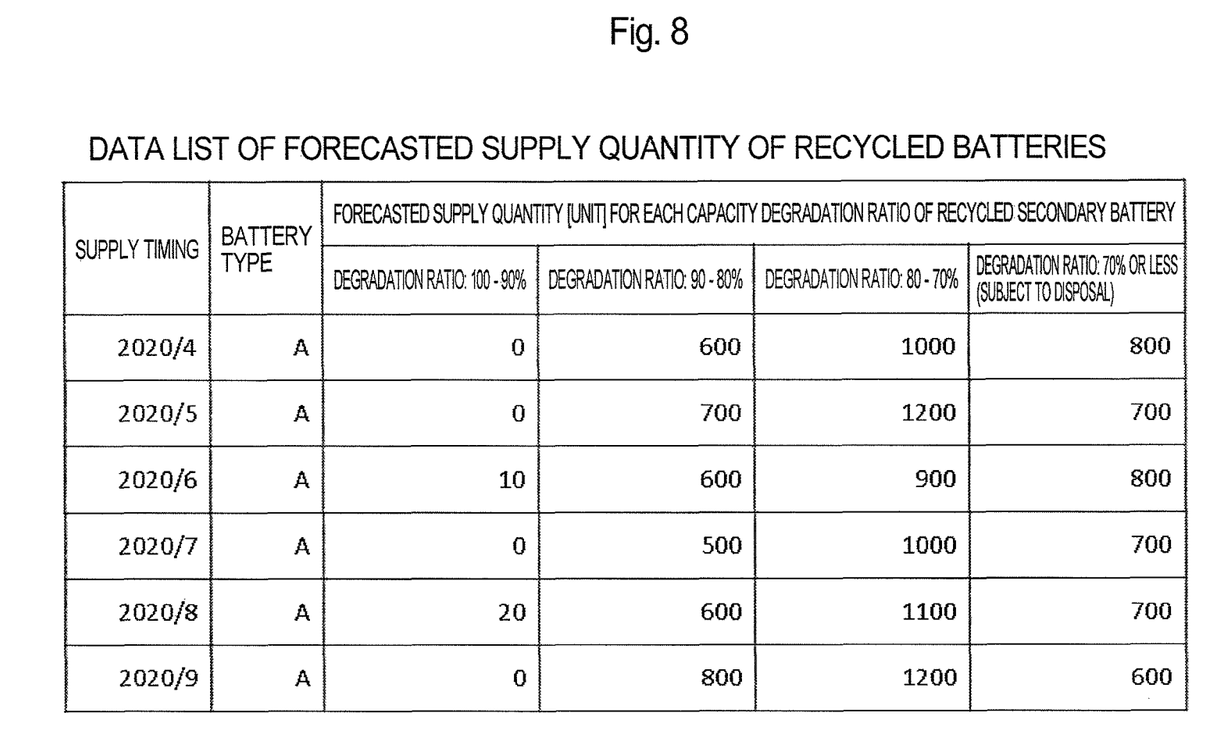
FIG. 8 is a diagram showing an example of a table of the forecast supply quantity of recycled batteries according to an embodiment of the present invention.

Finally, the battery supply quantity forecast unit 2012 presents the created recycled battery forecast supply quantity to the user (step S125). FIG. 8 shows an example of the table of the forecasted supply quantity of recycled batteries. Based on the foregoing processing, the user can refer to the number of forecasted supplies of the intended recycled battery.

As described above, according to this embodiment, it is possible to forecast the quantity level and the performance level of recyclable secondary batteries that can be supplied and when such a quantity can be supplied. Moreover, since it is also possible to simultaneously forecast the quantity level of secondary batteries which cannot be reused, it is possible to forecast the quantity of secondary batteries to be discarded as well.

Embodiment 2

In Embodiment 2, the recycled secondary battery supply forecast system according to the present invention is applied to a device (vehicle) with a recycled battery built therein.

The configuration and operation of the recycled secondary battery supply forecast system according to Embodiment 2 are the same as Embodiment 1. In Embodiment 2, the performance information of the recycled secondary battery mounted in the recycled battery built-in device, and the state information of the device are accumulated in the battery management server 203. In addition, based on the same procedures as Embodiment 1, the vehicle life/battery performance forecast unit 2011 makes a forecast of the performance of the recycled secondary batter at the end of life of the recycled battery built-in device. In addition, the battery supply quantity forecast unit 2012 counts the forecasted recycled battery supply count corresponding to the conditions designated by the user based on the battery performance forecast result of the battery, and provides the count.

Embodiment 3

In Embodiment 3, the recycled secondary battery supply forecast system according to the present invention is applied to secondary batteries other than secondary batteries that are mounted on vehicles. Specifically, for instance, considered may be stationary storage batteries for storing surplus electricity from solar generation or wind generation.

While the configuration and operation of the recycled secondary battery supply forecast system according to Embodiment 3 are the same as Embodiment 1, in Embodiment 3, in order to measure the life of a stationary storage battery, the used hours of the battery and electric energy that was input and output to and from the battery are accumulated in the battery management server 203 in substitute for the travel distance parameters used for making a forecast of the vehicle life in Embodiment 1.

Embodiment 4

In Embodiment 4, the recycled secondary battery supply forecast system according to the present invention is applied to the reuse forecast of a motor that is mounted on an electrically driven vehicle. Motors that are used in electrically driven vehicles are manufactured using rare earths such as neodymium. Thus, the reuse and recycling of the motor are desirable for global environmental protection.

In Embodiment 4, the vehicle life forecast is performed in the same manner as Embodiment 1. The performance information of the motor is measured using output torque, efficiency and other matters, and the reusability is determined based on these values.

This application relates to and Notes priority from Japanese Patent Application No. 2011-71836, filed on Mar. 29, 2011, the entire disclosure of which is incorporated herein by reference.

While the present invention was explained above with reference to the embodiments, the present invention is not limited to the foregoing embodiments. The configuration and details of the present invention may be modified variously as understood by those skilled in the art within the scope of the present invention.

Some or all of the foregoing embodiments may also be described as per the following Notes, but without limitation thereto.

(Note 1) A recycled secondary battery supply forecast system comprising a vehicle life/battery performance forecast unit which receives, from a plurality of vehicles, performance information of a secondary battery mounted on each of the vehicles and state information of the vehicle for determining a life of the vehicle, makes a forecast of an end of life of the vehicle by using history of the state information of that vehicle, and makes a forecast of performance of the secondary battery at the end of life of that vehicle by using history of the performance information of the secondary battery, and a battery supply quantity forecast unit which makes a forecast of a supply quantity of recyclable secondary batteries at a certain point in time in the future based on a forecast result of the performance of the secondary battery at the end of life of each vehicle.

(Note 2) The recycled secondary battery supply forecast system according to Note 1 above, wherein the state information of the vehicle indicates a travel distance of the vehicle, and the vehicle life/battery performance forecast unit makes a forecast of the end of life of the vehicle by calculating a timing of reaching a predetermined travel distance from an increasing trend of the travel distance of that vehicle.

(Note 3) The recycled secondary battery supply forecast system according to Note 1 above, wherein the state information of the vehicle indicates used hours of the vehicle, and the vehicle life/battery performance forecast unit makes a forecast of the end of life of the vehicle by calculating a timing of reaching predetermined used hours from an increasing trend of the used hours of that vehicle.

(Note 4) The recycled secondary battery supply forecast system according to Note 1 above, wherein the performance information of the secondary battery indicates a total capacity of the secondary battery, and the vehicle life/battery performance forecast unit makes a forecast of the performance of the secondary battery at the end of life of the vehicle by calculating the total capacity of the secondary battery at the end of the life of that vehicle from a decreasing trend of the total capacity of the secondary battery.

(Note 5) The recycled secondary battery supply forecast system according to Note 1 above, wherein the performance information of the secondary battery indicates a maximum output current of the secondary battery, and the vehicle life/battery performance forecast unit makes a forecast of the performance of the secondary battery at the end of life of the vehicle by calculating the maximum output current of the secondary battery at the end of the life of that vehicle from a decreasing trend of the maximum output current of the secondary battery.

(Note 6) The recycled secondary battery supply forecast system according to any one of Notes 1 to 5 above, wherein the timing of receiving the state information of the vehicle and the performance information of the secondary battery from each vehicle is at least one of the following: after lapse of a given period of time after previous reception; upon completion of charging of the secondary battery; and upon termination of use of the vehicle.

(Note 7) A recycled secondary battery supply forecast method, comprising the steps of receiving, from a plurality of vehicles, performance information of a secondary battery mounted on each of the vehicles and state information of the vehicle for determining a life of the vehicle, making a forecast of an end of life of the vehicle by using history of the state information of that vehicle, making a forecast of performance of the secondary battery at the end of life of that vehicle by using history of the performance information of the secondary battery, and making a forecast of a supply quantity of recyclable secondary batteries at a certain point in time in the future based on a forecast result of the performance of the secondary battery at the end of life of each vehicle.

The present invention is suitable for forecasting the quantity level and the performance level of recyclable secondary batteries that can be supplied and when such a quantity can be supplied.

10 recycled secondary battery supply forecast system
20 battery management server
30 communication network
40 vehicle
201 recycled battery supply forecast unit
202 communication unit
203 battery database
401 communication unit
402 battery management unit
403 secondary battery
2011 vehicle life/battery performance forecast unit
2012 battery supply quantity forecast unit

I claim:

1. A battery management server configured to communicate with a plurality of vehicles via a communication network, the battery management server comprising:

a communication interface configured to receive from the plurality of vehicles via the communication network performance information of a secondary battery mounted on each vehicle of the plurality of vehicles and state information of each vehicle of the plurality of vehicles;

memory configured to store the performance information and the state information; and a recycled secondary battery supply forecast system comprising:

a battery performance forecast unit configured to forecast an end of life of each vehicle of the plurality of vehicles by using history of the state information of each vehicle as stored in the memory, and configured to forecast performance of the secondary battery at the end of life of the corresponding vehicle by using history of the performance information of the secondary battery as stored in the memory, wherein the end of life is configured to indicate when a vehicle reaches a predetermined travel distance; and a battery supply quantity forecast unit configured to forecast supply quantities of recyclable secondary batteries mounted on the plurality of vehicles which will come to the end of life during a certain period of time in the future, wherein the forecast of supply quantities of recyclable secondary batteries specifies a quantity level of recyclable secondary batteries based on forecast results of the performances of the secondary batteries at the end of life of the plurality of vehicles, battery type and a supply period, the recyclable secondary batteries being reused in separate devices.

2. The battery management server according to claim 1, wherein the state information of each vehicle of the plurality of vehicles indicates a travel distance of the corresponding vehicle, and the battery performance forecast unit makes a forecast of the end of life of each vehicle of the plurality of vehicles by calculating a timing of reaching the predetermined travel distance from an increasing trend of the travel distance of the corresponding vehicle.

3. The battery management server according to claim 1, wherein the state information of each vehicle of the plurality of vehicles indicates used hours of the corresponding vehicle, and the battery performance forecast unit makes a forecast of the end of life of each vehicle of the plurality of vehicles by calculating a timing of reaching predetermined used hours from an increasing trend of the used hours of the corresponding vehicle.

4. The battery management server according to claim 1, wherein the performance information of the secondary battery indicates a total capacity of the secondary battery, and the battery performance forecast unit makes a forecast of the performance of the secondary battery at the end of life of each vehicle of the plurality of vehicles by calculating the total capacity of the secondary battery at the end of the life of the corresponding vehicle from a decreasing trend of the total capacity of the secondary battery.

5. The battery management server according to claim 1, wherein the performance information of the secondary battery indicates a maximum output current of the secondary battery, and the battery performance forecast unit makes a forecast of the performance of the secondary battery at the end of life of each vehicle of the plurality of vehicles by calculating the maximum output current of the secondary battery at the end of the life of the corresponding vehicle from a decreasing trend of the maximum output current of the secondary battery.

6. The battery management server according to claim 1, wherein the timing of receiving the state information of each vehicle of the plurality of vehicles and the performance information of the secondary battery from each vehicle of the plurality of vehicles is at least one of the following:

after lapse of a given period of time after previous reception;

upon completion of charging of the secondary battery; and upon termination of use of the corresponding vehicle.

7. A method for a battery management server in communication with a plurality of vehicles via a communication network to forecast a recycled secondary battery supply, comprising the steps of:

receiving by a communication interface from the plurality of vehicles via the communication network performance information of a secondary battery mounted on each vehicle of the plurality of vehicles and state information of each vehicle of the plurality of vehicles;

storing in a memory the performance information and the state information received by the communication interface;

making a forecast, with a battery performance forecast unit, of an end of life of each vehicle of the plurality of vehicles by using history of the state information of each vehicle as stored in the memory, wherein the end of life is configured to indicate when a vehicle reaches a predetermined travel distance;

making a forecast, with the battery performance forecast unit, of performance of the secondary battery at the end of life of the corresponding vehicle by using history of the performance information of the secondary battery as stored in the memory; and making a forecast, with a battery supply quantity forecast unit, of supply quantities of recyclable secondary batteries mounted on the plurality of vehicles which will come to the end of life during a certain period of time in the future, wherein the forecast of supply quantities of recyclable secondary batteries specifies a quantity level of recyclable secondary batteries based on forecast results of the performances of the secondary batteries at the end of life of the plurality of vehicles, a battery type and a supply period, the recyclable secondary batteries being reused in separate devices.

8. The battery management server according to claim 1, wherein the battery performance forecast unit makes a forecast of performance of the secondary battery at the end of life of the corresponding vehicle based on a travel distance of the vehicle.

9. The battery management server according to claim 1, wherein the battery performance forecast unit makes a forecast of performance of the secondary battery at the end of life of the corresponding vehicle based on the total number of hours that the vehicle was driven.

10. The battery management server according to claim 1, wherein the battery performance forecast unit makes a forecast of performance of the secondary battery at the end of life of the corresponding vehicle based on the period of use of the vehicle.

* * * * *